United States Patent [19]

Usagawa et al.

[11] Patent Number: 5,373,191
[45] Date of Patent: Dec. 13, 1994

[54] SEMICONDUCTOR DEVICE AND METHOD OF PRODUCING THE SAME

[75] Inventors: Toshiyuki Usagawa, Koganei; Yoshinori Imamura, Kanagawa; Hidekazu Okuhira, Hachiouji; Shigeo Goto, Kokubunji; Masayoshi Kobayashi, Hachiouji; Shinichiro Takatani, Kokubunji, all of Japan

[73] Assignee: Hitachi Ltd., Tokyo, Japan

[21] Appl. No.: 998,856

[22] Filed: Dec. 30, 1992

Related U.S. Application Data

[63] Continuation of Ser. No. 340,471, Apr. 19, 1989, Pat. No. 5,181,087, which is a continuation of Ser. No. 17,551, Feb. 24, 1989, abandoned.

[30] Foreign Application Priority Data

Feb. 28, 1986 [JP] Japan .................. 61-41768
Mar. 14, 1986 [JP] Japan .................. 61-54624

[51] Int. Cl.⁵ ............... H01L 29/80; H01L 29/48; H01L 29/06; H01L 23/48
[52] U.S. Cl. ........................... 257/773; 257/192; 257/194; 257/280; 257/284; 257/506; 257/616
[58] Field of Search ............... 257/773, 774, 622, 616, 257/615, 522, 506, 280–284, 194, 192

[56] References Cited

U.S. PATENT DOCUMENTS

| | | | |
|---|---|---|---|
| 4,160,984 | 7/1979 | Ladd | 357/55 |
| 4,426,656 | 1/1984 | DiLorenzo | 357/22 |
| 4,484,207 | 11/1984 | Nishizawa et al. | 357/16 |
| 4,503,600 | 3/1985 | Nii et al. | 357/22 |
| 4,593,301 | 6/1986 | Inata et al. | 357/22 |
| 4,618,877 | 10/1986 | Araki | 357/56 |
| 4,712,125 | 12/1987 | Bhatia et al. | 257/194 |
| 4,739,385 | 4/1988 | Bethea et al. | 357/30 |
| 4,812,886 | 3/1989 | Smith | 257/194 |
| 4,916,498 | 4/1990 | Berenz | 257/194 |
| 5,181,087 | 1/1993 | Usagawa et al. | 257/194 |

FOREIGN PATENT DOCUMENTS 61-99380 5/1986 Japan .................. 357/22

OTHER PUBLICATIONS

IBM Technical Disclosure Bulletin, vol. 28, No. 3, Aug. 1985, pp. 916–917 "Self-Aligned Recessed Gate MESFET".

Primary Examiner—Mark V. Prenty
Attorney, Agent, or Firm—Antonelli, Terry, Stout & Kraus

[57] ABSTRACT

Source and drain electrode metals of a field effect transistor having a recessed gate electrode metal are directly connected to a high impurity concentration semiconductor layer which faces the gate electrode metal through an insulator film which defines the side wall of the recess. The source and drain electrode metals may be disposed so as to face the gate electrode metal through the side insulator film. With this arrangement, it is possible to lower the parasitic resistance between the gate electrode and another electrode of the field effect transistor, to lower the contact resistance between a semiconductor layer and the source and drain electrodes, to reduce the capacitance of the recess gate electrode and to increase the source-gate breakdown voltage, advantageously. The above-described arrangement is particularly suitable for a transistor employing a compound semiconductor, and can also be applied to semiconductor devices other than field effect transistors. Such semiconductor devices can readily be produced by forming a gate electrode metal with a self-alignment process using the lift-off method.

5 Claims, 9 Drawing Sheets

SEMICONDUCTOR DEVICE AND METHOD OF PRODUCING THE SAME

This is a continuation of application Ser. No. 340,471 filed Apr. 19, 1989 and now U.S. Pat. No. 5,186,087, which is a continuation of application Ser. No. 017,551 filed Feb. 24, 1987, now abandoned.

BACKGROUND OF THE INVENTION

The present invention relates to a semiconductor device having a recessed electrode structure and, more particularly, to a field effect transistor having a recessed gate electrode structure and a method of producing the same.

With the recent development of superhigh precision crystal growth techniques such as the MBE (Molecular Beam Epitaxy) and the MOCVD (Metal Organic Chemical Vapor Deposition), realization of superhigh speed devices (e.g., that disclosed in the specification of Japanese Patent Laid-Open No. 132074/1980) utilizing a gallium arsenide (GaAs) and aluminum gallium arsenide (AlGaAs) hetero junction is under way. Since an excellent insulating material for a GaAs/AlGaAs hetero junction has not yet to be found, Schottky junctions formed by metals and compound semiconductors are employed to constitute gate structures for various kinds of field effect transistor (FET).

FIG. 1 is a cross-sectional view of a selectively doped hetero junction FET as one example of the above-described conventional FETs. In the figure, the reference numeral 100 denotes a semi-insulating GaAs substrate, 11 an undoped GaAs layer, 12 an undoped AlGaAs layer (not intentionally containing any impurity, and in many cases, resulting in an n$^-$-type layer having an impurity concentration of $10^{15}$ cm$^{-3}$) known as a spacer, the layer 12 generally having a film thickness e of about 60 Å. The numeral 13 denotes an n-type AlGaAs layer, and 14 an n-type GaAs layer. The total film thickness d of the AlGaAs layers 12 and 13 is generally about 500 Å. The numeral 31 denotes a gate metal of an enhancement type FET (the threshold voltage $V_{th}$: about 0.1 V), 30 a gate metal of a depletion type FET (the threshold voltage $V_{th}$: about $-0.8$ V; the gate voltage $V_G = 0$ V at which the channel is open). Representing the doping level of the n-type AlGaAs layer 13 by $N_D$ for simple calculation, the threshold voltage $V_{th}$ may be given in the main term as follows:

$$V_{th} = \phi_{Bn} - \Delta E_c/q - \frac{qN_D}{2\epsilon}(d-e)^2 \quad (1)$$

where $\phi_{Bn}$ represents the height of the Schottky barrier between the gate metal and the AlGaAs layer, $\Delta E_c$ the size of discontinuity of the conduction band edge between the GaAs layer 11 and the AlGaAs layer 12, q the unit charge, and $\epsilon$ the dielectric constant of AlGaAs. A critical consideration in improvement of such FETs in performance lies in lowering the parasitic resistance $R_{sg}$ of the gap between the source 32 and the gate 30 and that between the source 34 and the gate 31. The parasitic resistance $R_{sg}$ is generally represented as follows:

$$R_{sg} = \frac{L_{sg}}{w}\rho_s + \frac{\gamma_c}{w} \quad (2)$$

where $L_{sg}$ represents the distance between the source and the gate, w the width of the transistor, $\gamma_c$ the contact resistance of the source electrode, and $\rho_s$ the carrier sheet resistance of the portion between the source and the gate. The minimum source-gate distance $L_{sg}$ which can be obtained by the use of photolithography or electron beam lithography is generally about 0.5 to about 0.8 μm. The sheet resistance $\rho_s$ is about 1 kΩ/☐ to 100 Ω/☐. It is characteristic of FETs employing compound semiconductors to involve a considerably high sheet resistance $\rho_s$ (the sheet resistance of Si-MOSFETs is generally about 1 to about 5 Ω/☐). This is mainly because the upper limit of the carrier density in compound semiconductors is relatively low, i.e., $2 \times 10^{18}$ cm$^{-3}$.

On the other hand, there have been known one type of GaAs MESFET (Metal-Semiconductor Field Effect Transistor) employing compound semiconductors such as gallium arsenide (GaAs) and another type of FET employing as an active layer a two-dimensional electron gas (2 DEG) formed at the hetero junction interface between aluminum gallium arsenide (AlGaAs) and GaAs (such FETs being known as 2 DEG-FETs). These FETs are employed as low-noise high-frequency FETs. FIG. 2 is a cross-sectional view of an FET of the type described above. An n$^+$-type GaAs layer 15 (the doping level: $2 \times 10^{18}$ cm$^{-3}$; the film thickness: about 2000 Å) is formed for the purpose of lowering the parasitic resistance between the source and the gate. A gate electrode 30 is formed using a so-called recessed structure. Such recessed structure is generally formed using a chemical etching so as to have a depth of 3000 to 4000 Å, and a gap which generally has a size of 0.1 to 0.2 μm and a sheet resistance of about 1 kΩ/☐ is formed between the n$^+$-type GaAs layer 15 and the gate electrode 30 as shown in FIG. 2, which results in an increase in the parasitic resistance.

In order to prevent such increase in the parasitic resistance, improved recessed structures have been proposed and carried out, such as that shown in FIG. 3 in which the gate metal 30 is self-aligned with the recess and that shown in FIG. 4 in which a side insulator film 5 is formed between the gate metal 30 and the n$^+$-type GaAs layer 15.

Low-noise high-frequency FETs of the type described above are described in, for example, "IEEE, ED 27 (1980), page 1029". In the above-described figures, the reference numeral 9 denotes an n-type GaAs active layer, 32 a source electrode, 33 a drain electrode, and 35 an overhang portion of the gate metal 30 overhanging the n$^+$-type GaAs layer 15. The broken line below the n-type GaAs active layer represents the boundary between the substrate and the active layer.

The prior arts shown in FIGS. 3 and 4 are effective in lowering the parasitic resistance. However, in the self-alignment process with respect to a recess such as that shown in FIG. 3, the gate metal 30 is in direct contact with the n$^+$-type GaAs layer 15, and the source-gate breakdown voltage (the voltage at which a leakage current flows when the source and the gate are reverse-biased) is about 1.5 to about 3.0 V, which is far lower than a practical level, i.e., 7 to 10 V, disadvantageously. On the other hand, the structure, in which the insulator 5 is formed between the gate metal 30 and the n$^+$-type GaAs layer 15 in order to prevent deterioration of the source-gate breakdown voltage, involves the problem that the gate metal 30 which overhangs the n$^+$-type GaAs layer 15 (see a portion of the gate metal denoted by the reference numeral 35) substantially doubles the gate capacitance.

In an FET having the structure shown in FIG. 2, even if the n+-type GaAs layer 15 is formed thick, the sheet resistance $\rho_s$ between the source and the gate is about 100 $\Omega/\square$.

The contact resistance $\gamma_c$ of the source electrode is about 0.2 $\Omega$mm, and the lower limit thereof is given by the fact that the doping level of the n+-type GaAs layer which is in contact with the source and drain electrode metals is $2\times 10^{18}$ cm$^{-3}$. If the sheet resistance $\rho_s$ is lowered to several $\Omega/\square$ or less and the contact resistance $\gamma_c$ is lowered to 0.02 $\Omega$mm or less, it is possible to expect a great improvement in performance of the FETs.

In the above-described prior arts, the parasitic resistance is increased mainly because the distance $L_{sg}$ between the source and the gate is 0.5 $\mu$m or more and a portion of the semiconductor which defines the gap between the source and gate has a sheet resistance of about 100 $\Omega/\square$.

SUMMARY OF THE INVENTION

It is an object of the present invention to provide a high-performance semiconductor device, particularly a semiconductor device employing a compound semiconductor and, more particularly, a field effect transistor employing a compound semiconductor, which is so designed that the parasitic resistance or sheet resistance between a recessed electrode and another or second electrode is considerably lowered and the contact resistance between the another or the second electrode and a semiconductor layer is lowered and further the capacitance of the recessed electrode is lowered and the source-gate breakdown voltage is increased, thereby overcoming the disadvantages of conventional semiconductor devices having recessed electrode structures.

It is another object of the present invention to provide a method which enables the above-described semiconductor device to be readily produced.

To these ends, the present invention provides a semiconductor device in which an electrode metal which is directly connected to a predetermined one of the active semiconductor layers which constitute a semiconductor device such as a transistor is isolated through a side insulator layer from at least one of the other layers provided on the predetermined active layer, the electrode metal being formed in a cut portion, that is, a recess formed in said layer provided on the predetermined active layer. It is particularly preferable to form the electrode metal only inside said recess. Accordingly, this electrode metal may be regarded as a recessed electrode. The above-described active semiconductor layers include, in practice, a channel layer of a field effect transistor, the emitter, base and collector of a bipolar transistor, etc. Said other layers provided on the predetermined active layer must include at least one layer which is required to be isolated from the recessed electrode metal. More specifically, said other layers include, for example, a high impurity concentration semiconductor layer and another electrode metal layer.

The present invention is mainly directed to field effect transistors, but semiconductor devices according to the present invention are not necessarily limited thereto. In the case of a field effect transistor, the recessed electrode defines a gate electrode metal.

Said other layers, which are disposed on the active layer to which the electrode metal is directly connected and which are adjacent to the side insulator layer, include a high impurity concentration semiconductor layer and/or an electrode metal (hereinafter referred to as a "second electrode metal") other than the recessed electrode for the purpose of lowering the parasitic resistance or the sheet resistance. If an electrode metal other than the recessed electrode is provided so as to be directly connected to the high impurity concentration semiconductor layer, this semiconductor layer acts to lower the contact resistance of the second electrode metal, advantageously. In the case of a field effect transistor, the second electrode metal is defined by a source electrode metal or source and drain electrode metals.

The thickness of the side insulator layer is set at 100 to 3000 Å, more preferably 100 to 1000 Å. A thickness less than this thickness range is unsatisfactory in the insulating performance of the insulator, whereas a thickness exceeding the thickness range increases the resistance between the recessed electrode metal and the second electrode metal, unfavorably. Examples of insulators which may be employed in the present invention include insulating materials which are readily available in the form of a thin film, such as SiN, Si$_3$N$_4$, SiO$_2$ and amorphous Si. Air may also be employed as an insulator.

The above-described type of transistor generally employs a compound semiconductor such as a GaAs compound.

A semiconductor device according to the present invention is readily obtained by forming an electrode metal which is directly connected to one of the active semiconductor layers constituting a transistor, e.g., a gate electrode metal of a field effect transistor, in such a manner that the electrode metal is self-aligned with a recess portion. More specifically, a semiconductor device according to the present invention is readily obtained by, for example, a manufacturing method which comprises the steps of: i) successively forming layers for constituting a transistor on a substrate; ii) forming a recess for forming an electrode metal by a photoetching technique so that a predetermined active semiconductor layer to which a predetermined electrode metal is to be connected is exposed at the bottom of the recess; iii) providing an insulator film over the inner surface of the recess at such a temperature that a photoresist film employed in the photoetching in the step ii) is not deformed; iv) removing a portion of the insulator film provided in the step iii) which is disposed on the bottom inside the recess and a portion of the insulator film which is provided over the photoresist film to define a side insulator film; and v) forming an electrode metal within the recess using the photoresist film as a mask, and lifting off the metal deposited on the mask. With this manufacturing method, the electrode metal can be formed within the recess by carrying out a photoresist step only once.

DESCRIPTION OF THE PREFERRED EMBODIMENTS

The outline of the present invention will first be explained practically with reference to the accompanying drawings.

Figures 5A, 5B:
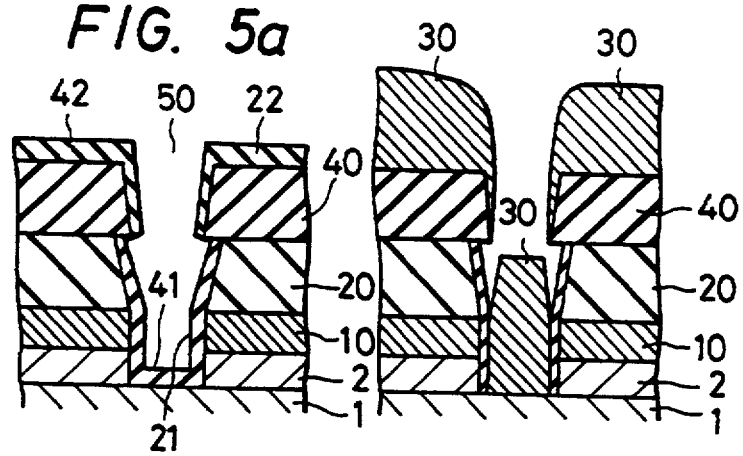
FIGS. 5a and 5b are cross-sectional views of one example of the field effect transistor according to the present invention, which illustrate steps in the process for producing the same.

The cross-sectional structure of a field effect transistor (in a broad sense) according to the present invention is shown in FIGS. 5a and 5b. A layer 1 which serves as an active layer of a transistor or which corresponds to such active layer is provided thereon with a high impurity concentration (approximately ranging from $2 \times 10^{18}$ cm$^{-3}$ to $10^{21}$ cm$^{-3}$) semiconductor layer 2 for lowering the parasitic resistance. Further, source and drain electrode metals 10 are formed. A gate electrode metal 30 is formed so as to be self-aligned with the source and drain electrode metals 10 by the use of a lift-off process, thus attaining the above-described object. More specifically, after an insulator 20 for lift-off, e.g., CVD SiO$_2$, has been formed over the whole surface, a photoresist 40 for forming a gate electrode is applied, and the insulator 20 and the source and drain electrode metals 10 and the high impurity concentration semiconductor layer 2 are then selectively removed by a dry etching or a chemical etching to expose a portion of the semiconductor layer 1 with which a gate electrode is to be brought into contact. Then, insulators 21 and 22 are deposited by the use of a low-temperature process (any process which has no effect, such as large deformation, on the photoresist 40) such as photo chemical vapor deposition. The point in this deposition is that the insulators 21 and 22 are formed on the side walls of a recess for forming a gate electrode. Then, the insulator 21 on the bottom 41 of the gate recess portion and the insulator 22 on the photoresist 40 are removed by a dry etching or other similar means, and after etching residues have been removed, a gate electrode metal 30 is deposited over the whole surface by evaporation as shown in FIG. 5b. Then, the metal 30 on the photoresist 40 is lifted off. At this time, the spacer for lift-off is defined by the photoresist 40 and the spacer insulator film 20. More specifically, the feature of the present invention resides in that, after the side insulator films 21 and 22 have been formed so as to cover the source and drain metals 10 and the gate photoresist 40 by a low-temperature process, the insulator films 21 and 22 are selectively removed by etching so that the side insulator film 21 is left, and a gate metal is deposited by evaporation and a gate is then formed by lift-off.

Isolation between the source (drain) metal 10 and the gate metal 30 is effected by the use of a single gate photoresist step and a low-temperature insulator film forming method and may also be achieved by other means. It is essential that the source (drain) metal 10 and the gate metal 30 be isolated from each other through the side insulator film 21 as shown in FIG. 5b, in the final finished state.

The above-described recessed electrode structure in which the distance between the source and the gate is reduced to the utmost extremity may be considered to be basically different from the conventional structures shown in FIGS. 1 to 4. With the conventional methods, even when a recess electrode structure is formed by utilizing self-alignment or mask alignment, the lower limit of the distance $L_{sg}$ between the source and gate is on the level of 0.5 μm. The reason why the above-described structure can be obtained is that it becomes possible to employ a low-temperature insulator forming method which enables an insulator to be formed with an excellent coverage and at relatively low temperatures on the order of room temperature.

The above-described formation of source and gate electrodes using a self-alignment type side insulator forming method enables the distance $L_{sg}$ between the source 10 and the gate 30 to be reduced to 0.15 μm or less. In this recessed electrode structure, the source electrode metal 10 is connected to the high impurity concentration layer 2. Therefore, when the impurity concentration of the high impurity concentration layer 2 is on the level of $10^{20}$ cm$^{-3}$, the contact resistance $\gamma_c$ can be lowered to 0.02 Ωmm or less.

Since the side insulator 21 is present for the purpose of isolating the source metal 10 and the gate metal 30 from each other, the insulator 21 may be removed after the removal of the photoresist 40 in the state shown in FIG. 5b. In this case, it is necessary to form a passivation film after the removal of the insulator 21.

If an extremely low deposition rate (about 30 Å/min) by photo chemical vapor deposition is utilized, the distance $L_{sg}$ between the source and the gate can be controlled with considerably excellent controllability.

Figure 1:
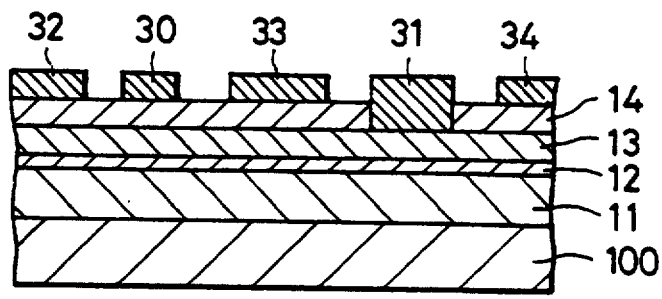
FIGS. 1 to 4 are cross-sectional views schematically illustrating conventional field effect transistors, respectively.
Figure 2:
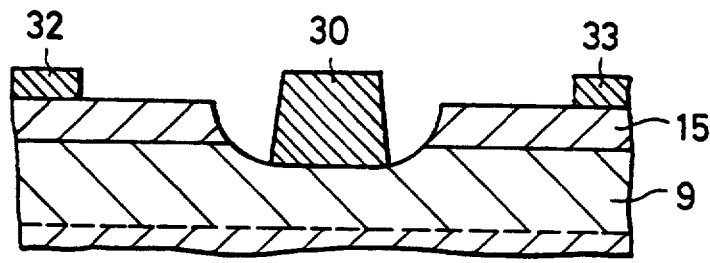
Figure 3:
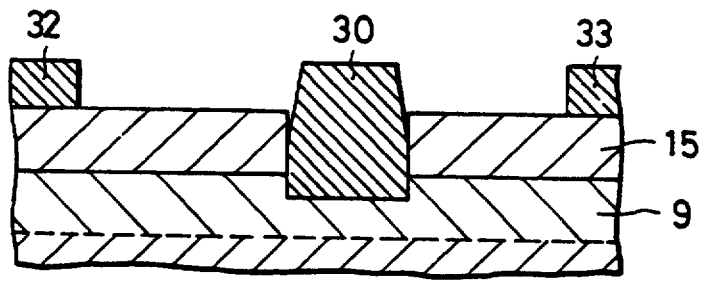
Figure 4:
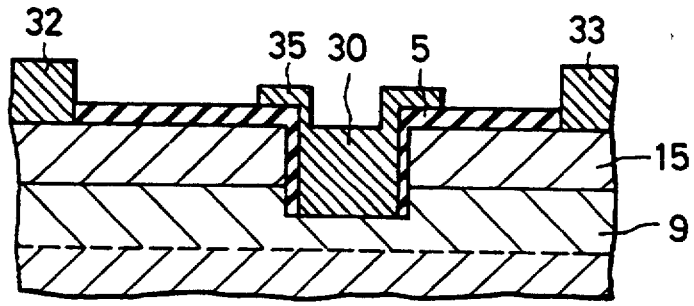
Figure 6A:
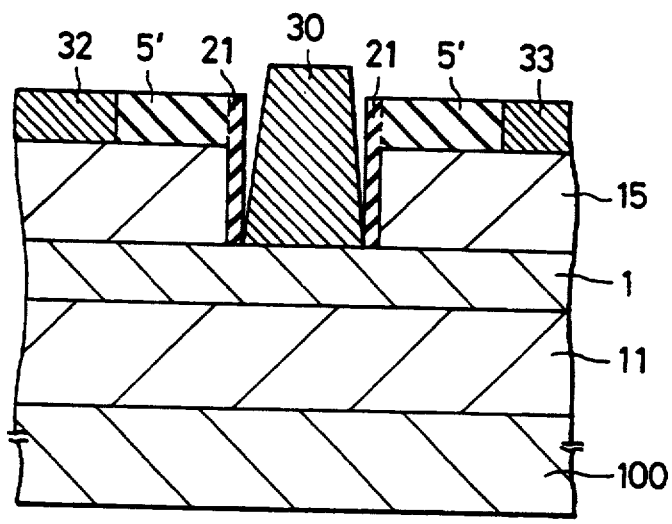
FIG. 6a is a cross-sectional view illustrating another example of the field effect transistor according to the present invention.
Figure 6B:
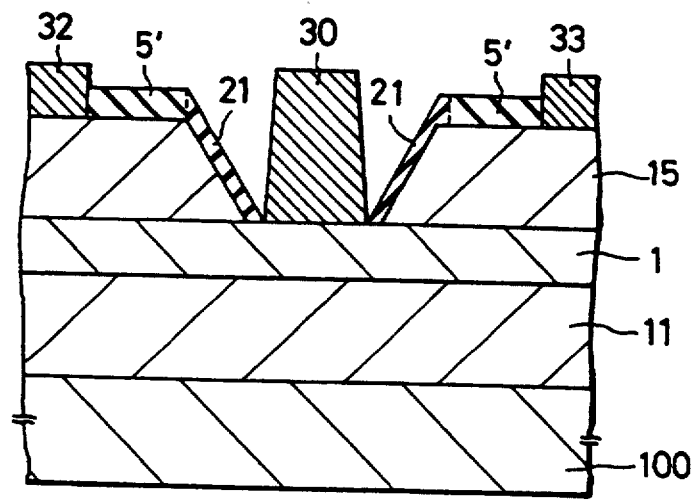
FIG. 6b is a cross-sectional view illustrating still another example of the field effect transistor according to the present invention.

Referring next to FIGS. 6a and 6b, there are shown examples of the structure of a field effect transistor according to the present invention which is so designed that the disadvantages of the conventional field effect transistors shown in FIGS. 2 to 4 are overcome and the parasitic resistance is lowered without leading to any increase in the gate capacitance or deterioration of the source-gate breakdown voltage. The illustrated structures are intended for GaAs MES FETs. In contrast to the conventional structure shown in FIG. 4, the structures shown in FIGS. 6a and 6b feature that an insulator is formed only on the side walls of the n+-type GaAs amcap layer 15 and a gate metal is formed only inside a recessed structure. In such FET structure, the parasitic resistance between the n+-type GaAs layer 15 and the gate metal 30 is constituted only by the parasitic resistance of a gap which is determined by the film thickness (approximately 1000 Å or less) of the side insulator film 21 and therefore extremely small, which means that there is no increase in the parasitic resistance. Since the gate metal 30 and the n+-type GaAs layer 15 are isolated from each other by the side insulator film 21, there is no deterioration of the source-gate breakdown voltage. In addition, since the gate metal 30 is formed only inside the recessed structure, there is also no increase in the source-gate capacitance. Such structure is obtained by forming the gate metal 30 in self-alignment with the recessed structure.

In FIGS. 6a and 6b, the reference numeral 5' denotes a surface protection film (an insulator film for passivation), 11 an undoped GaAs layer, 1 an active semiconductor layer, 32 a source electrode metal, 33 a drain electrode metal, and 100 a semi-insulating GaAs substrate.

EMBODIMENT 1

Figure 7A:
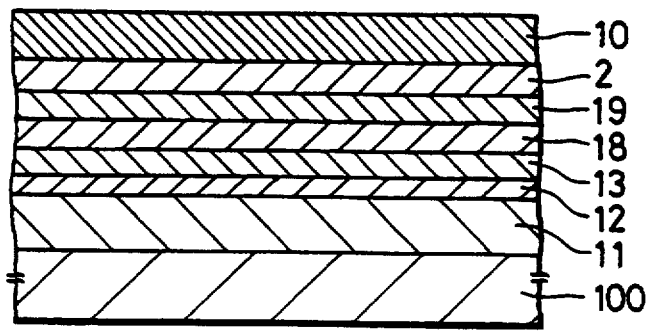
FIGS. 7a to 7c are cross-sectional views of a field effect transistor in accordance with one embodiment of the present invention, which show steps in the process for producing the same.
Figure 7B:
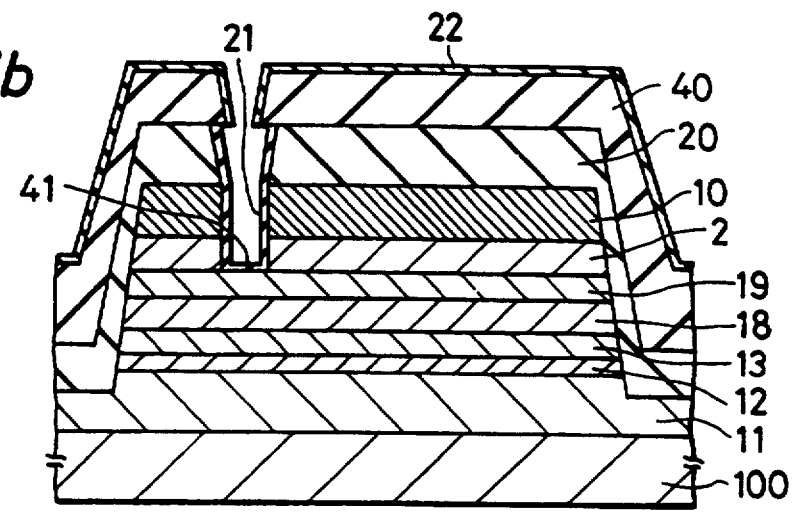
Figure 7C:
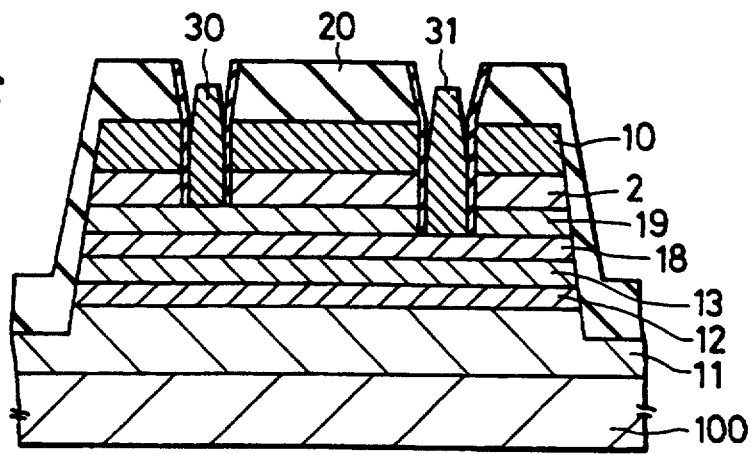

FIGS. 7a to 7c are cross-sectional views showing steps in the process for producing a so-called selectively doped hetero junction FET employing a two-dimensional electron gas as a channel layer in accordance with this embodiment.

Referring to FIG. 7a, a p⁻-type (about $5 \times 10^{14}$ cm$^{-3}$) GaAs layer 11 having a thickness of 1 μm is grown on a semi-insulating GaAs substrate 100 by the use of MBE (Molecular Beam Epitaxy). Subsequently, an n⁻-type undoped $Al_xGa_{1-x}As$ (x being generally selected to be 0.3 or more) layer 12 having a thickness of 60 Å is grown on the layer 11. Then, an n-type $Al_y Ga_{1-y}As$ (y being generally used in the range from 0.05 to 0.25) layer 13 which contains Si as an n-type impurity at a concentration of $2 \times 10^{18}$ cm$^{-3}$ and has a thickness of 150 Å is grown on the layer 12, and an undoped n⁻-type $Al_zGa_{1-z}As$ (z being generally selected to be about 0.3) layer 18 having a thickness of 100 Å is then grown as a separation layer. Further, an undoped n⁻-type GaAs layer 19 having a thickness of 100 Å is grown on the layer 18, and an n+-type Ge layer 2 which contains As at a concentration of $2 \times 10^{20}$ cm$^{-3}$ and has a thickness of 300 Å is grown on the layer 19. Under an ultra-high vacuum, this is moved to another chamber, where an Al layer 10 which is to define source and drain electrode metals is formed so as to have a thickness of 3000 Å. Then, etching is carried out to isolate transistors from each other, and a CVD SiO₂ 20 having a thickness of 4000 Å is formed as a lift-off spacer for formation of a gate electrode metal. Further, a photoresist 40 for forming gates is applied and processed, and with this photoresist 40 employed as a mask, the SiO₂ 20 is selectively removed by a dry etching to form a recess. This recess is tapered in an inverted trapezoid shape by a wet etching so that lift-off process can readily be used. Then, the source and drain electrode metal layer 10 and the n+-type Ge layer 2 are selectively removed by the use of a dry etching. Thereafter, etching residues are removed by a chemical process.

Insulators 21 and 22 of SiN each having a thickness of 1000 Å are deposited at room temperature using photo chemical vapor deposition to obtain a structure such as that shown in FIG. 7b. In this case, the insulators 21 and 22 are not necessarily limited to SiN, and SiO₂, amorphous Si or the like may also be employed. The insulators 21 and 22 may also be formed using ECR (Electron Cyclotron Resonance) plasma chemical vapor deposition.

Then, with the side insulator film 21 left, the insulator 22 of SiN and the portion 41 of the insulator 21 deposited on the bottom of the recess are removed by the use of an anisotropic dry etching. Al is then deposited by vacuum deposition so as to have a thickness of 6000 Å and then lifted-off to provide a gate electrode 30 (see FIG. 7c). The threshold voltage $V_{th}$ of the depletion type FET thus fabricated has experimentally been found to be −0.8 V. Next, in order to form an enhancement type FET, photoresist and etching steps similar to those described above are carried out. The process carried out in this case differs from the former process in that, in this process, the undoped GaAs layer 19 is also selectively removed by RIE (Reactive Ion etching) using a gas mixture of $CCl_2F_2$ and He. Thus, an enhancement type FET having a threshold voltage $V_{th}$ of about 0.1 V is obtained. The gate metal 31 in this case is Al in the same manner as in the case of the depletion type FET (see FIG. 7c). Source and drain electrodes may be formed by a conventional method in a such manner that, after the photoresist step, the SiO₂ 20 is selectively removed, and each of the source and drain electrodes is formed so as to be connected to the source and drain metal 10. Although in this embodiment Al is exemplarily employed as the source metal 10, it is possible to employ any metal which can be processed by a dry etching and brought into ohmic contact with the high impurity concentration layer 2, such as Au, Pt and Mo. Further, although n+-type Ge is exemplarily of the high impurity concentration layer 2, this is not necessarily limitative and it is possible to employ any substance which can serve as a barrier semiconductor which is in ohmic contact with the source metal 10 and the active layers 18, 19, 13 and 12.

EMBODIMENT 2

Figure 8A:
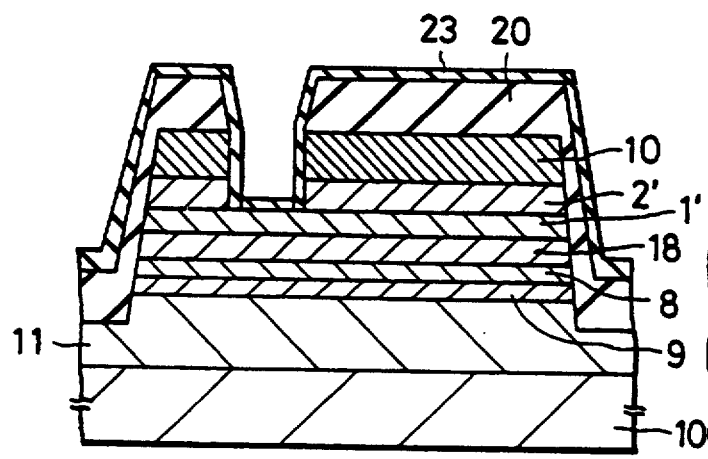
FIGS. 8a and 8b are cross-sectional views of a field effect transistor in accordance with one embodiment of the present invention, which show steps in the process for producing the same.
Figure 8B:
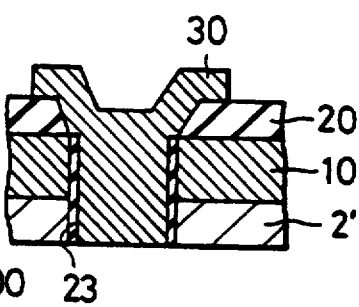

In the embodiment shown in FIGS. 8a and 8b, the present invention is applied to a low-noise and ultrahigh-frequency GaAs MESFET. An undoped GaAs layer 11 (1 μm thick), a pair of GaAs/AlGaAs super lattice buffer layers 8 and 9 (5000 Å thick), an undoped $Al_xGa_{1-x}As$ (x: about 0.3) layer 18 (1000 Å thick) and an n-type GaAs (the doping level: $5 \times 10^{17}$ cm$^{-3}$) layer 1' (500 Å thick) are successively formed on a semi-insulating GaAs substrate 100 by the use of the MOMBE (metal organic molecular beam epitaxy). Then, a high impurity concentration (containing As at a concentration of $2 \times 10^{20}$ cm$^{-3}$) n+-type Ge layer 2' is formed, and a source and drain electrode metal layer 10 consisting of three layers, that is, Ti, Pt and Au, is formed so as to have a thickness of 3000 Å. Further, CVD SiO₂ 20 which serves as an insulator film for minimizing the fringing capacitance of the source-gate capacitance $C_{gs}$ is formed. Then, photolithography is carried out to form a gate portion. More specifically, the SiO₂ 20, the source and drain electrode metal layer 10 consisting of Ti/Pt/Au layers and the n+-type Ge layer 2' are selectively removed by a dry etching to form a recess portion. Subsequently, the gate recess portion is covered with Si$_3$N$_4$ 23 having a thickness of 100 nm by a conventional CVD as shown in FIG. 8a. The Si$_3$N$_4$ 23 on the bottom of the gate portion and on the flat portion of the surface of the SiO$_2$ 20 is removed by a dry etching, and as a gate electrode a combination of Mo and Au layers is deposited to a thickness of 8000 Å by vacuum deposition and then subjected to a dry etching to form a gate electrode 30 as shown in FIG. 8b. The above-described FET was experimentally produced and the characteristics thereof were measured. The results of measurement have found that it is possible to reduce the source-gate distance L$_{sg}$ to 0.15 μm and lower the ohmic contact resistance γ$_c$ to 0.02 Ωmm.

EMBODIMENT 3

Figure 9:
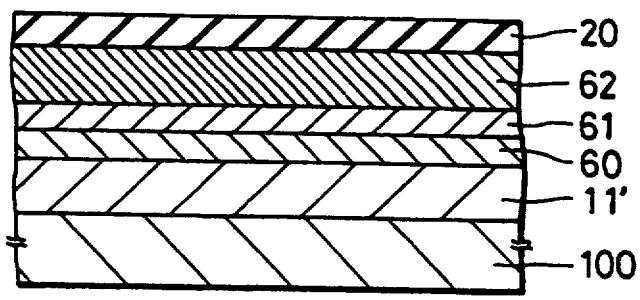
FIG. 9 is a cross-sectional view of a field effect transistor in accordance with one embodiment of the present invention, which shows one step in the process for producing the same.

In the embodiment shown in FIG. 9, the present invention is applied to a p-channel selectively doped hereto junction FET. An n$^-$-type (the doping level: about 10$^{14}$ cm$^{-3}$ or less) GaAs layer 11' having a thickness of 1 μm is grown on a semi-insulating GaAs substrate 100 by the use of MO-MBE, and Al$_y$Ga$_{1-y}$As (y: about 0.4) 60 containing Be at a concentration of 2×10$^{18}$ cm$^{-3}$ is then formed to a thickness of 500 Å. Further, a p$^+$-type Ge layer 61 containing boron (B) at a concentration of 2×10$^{20}$ cm$^{-3}$ is formed to a thickness of 3000 Å, and this is moved to another ultrahigh vacuum chamber, where a Ti layer 62 having a thickness of 3000 Å and an SiO$_2$ layer 20 as a spacer having a thickness of 4000 Å are formed.

Thereafter, a process similar to that in the embodiment 2 is carried out, and a gate metal is formed using a double layer of Mo and Au so as to be in Schottky contact with a p-type Al$_y$Ga$_{1-y}$As layer 60. The FET produced as described above has been confirmed that it is possible to reduce the source-gate distance and lower the contact resistance of the source electrode as in the case of the above-described embodiments.

EMBODIMENT 4

Figure 10:
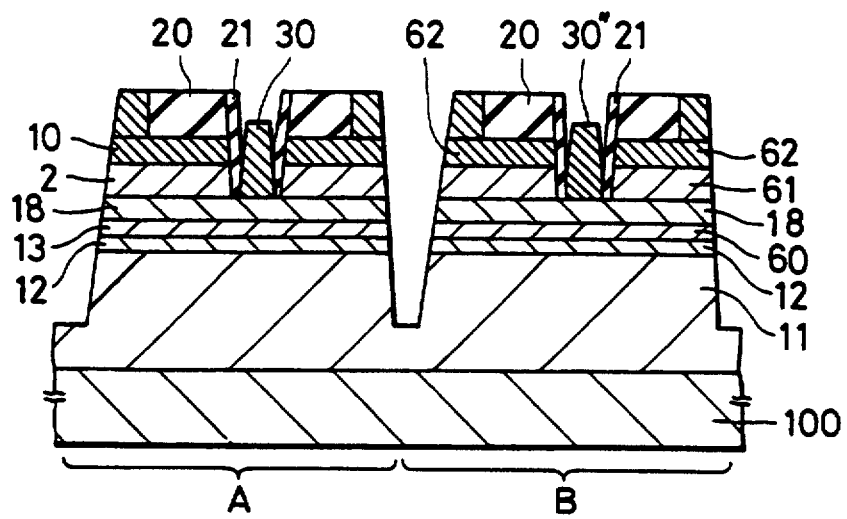
FIG. 10 is a cross-sectional view of a field effect transistor in accordance with one embodiment of the present invention.

FIG. 10 shows an embodiment in which the present invention is applied to a complementary selectively doped hetero junction FET. After an n-channel FET (see the portion A in FIG. 10) has been formed in a manner similar to that in the case of the embodiment 1, an FET employing a two-dimensional hole gas as a carrier is formed as shown in the portion B of FIG. 10 by the use of a selective epitaxial growth method. Unlike the embodiment 3, this embodiment employs an n$^-$-type Al$_x$Ga$_{1-x}$As layer 12 having a thickness of 30 Å for the purpose of improving the hole mobility. Further, in order to increase the dielectric strength of the Schottky junction, an undoped Al$_x$Ga$_{1-x}$As layer 18 having a thickness of 150 Å is formed. In both n- and p-channel FETs, an insulator layer 21 which is formed of SiN is formed over the side walls of the recess portion by photo chemical vapor deposition in order to prevent the source and drain electrodes 10, 62 and the gate electrodes 30, 30" from contacting each other, respectively.

EMBODIMENT 5

Figure 11A:
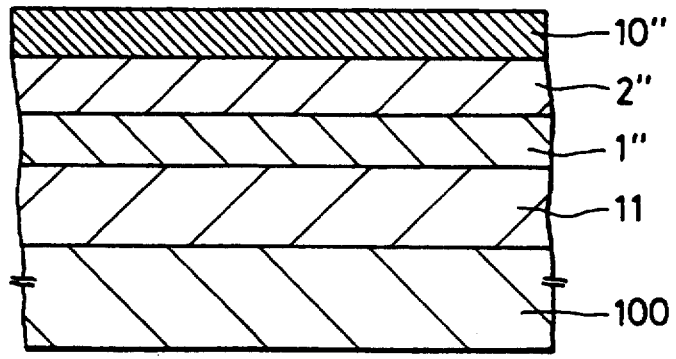
FIGS. 11a and 11b are cross-sectional views of a field effect transistor in accordance with one embodiment of the present invention, which show steps in the process for producing the same.
Figure 11B:
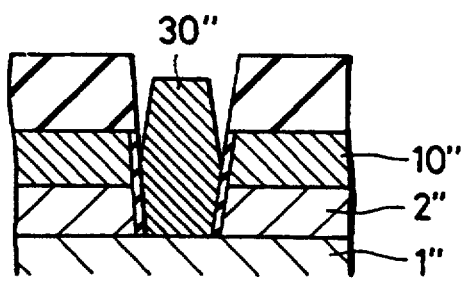

FIGS. 11a and 11b show in combination an embodiment in which an n$^+$-type GaAs layer is employed as a high impurity concentration semiconductor layer. An O$_2$-doped GaAs layer (semi-insulating) 11 having a thickness of 1 μm is formed on a semi-insulating GaAs substrate 100 by the use of MOCVD. Further, an Si-doped (4×10$^{17}$ cm$^{-3}$) GaAs layer 1" having a thickness of 700 Å and an Si-doped (2×10$^{18}$ cm$^{-3}$) GaAs layer 2" having a thickness of 3000 Å are successively formed, and an electrode metal layer 10" consisting of three layers of AuGe, Ni and Au is then deposited as shown in FIG. 11a by the use of a vacuum deposition. Thereafter, mesa etching is carried out to isolate elements from each other, and a gate electrode 30" is formed as shown in FIG. 11b by the use of Mo and Au in a manner similar to that in the case of the embodiment 1.

EMBODIMENT 6

Figure 12A:
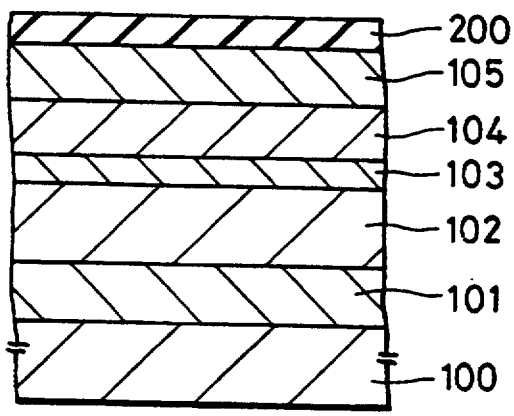
FIGS. 12a to 12c are cross-sectional views of a semiconductor device in accordance with one embodiment of the present invention, which show steps in the process for producing the same.
Figure 12B:
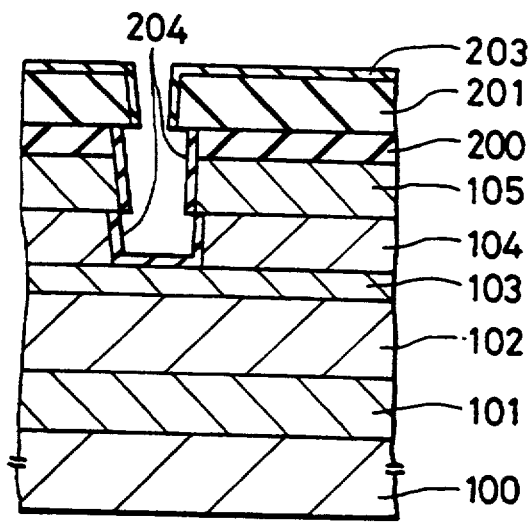
Figure 12C:
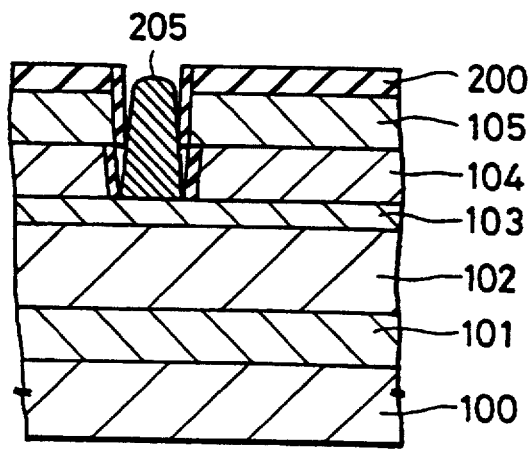

FIGS. 12a to 12c show in combination an embodiment in which the electrode forming method according to the present invention is applied to formation of a base electrode of an HBT (Hetero-junction Bipolar Transistor). An n$^+$-type GaAs layer 101 containing Si at a concentration of 4×10$^{18}$ cm$^{-3}$ and having a thickness of 5000 Å is formed on a semi-insulating GaAs substrate 100 by the use of MBE, on which are successively formed n$^-$-type GaAs 102 containing Si at a concentration of 5×10$^{14}$ cm$^{-3}$ and having a thickness of 4000 Å, p-type GaAs 103 (base layer) containing Be at a concentration of 2×10$^{18}$ cm$^{-3}$ and having a thickness of 2000 Å, n-type Al$_x$Ga$_{1-x}$As (x: about 0.3) 104 containing Si at a concentration of 2×10$^{17}$ cm$^{-3}$ and having a thickness of 4000 Å and n-type GaAs 105 containing Si at a concentration of 5×10$^{18}$ cm$^{-3}$ and having a thickness of 4000 Å. Thereafter, a CVD SiO$_2$ film 200 is deposited as shown in FIG. 12a. The step which is carried out to form a base electrode will next be explained with reference to FIGS. 12b and 12c. The emitter electrode may be formed by the use of a conventional method, and the collector electrode may be formed by a method similar to that used to form the base electrode. After a photoresist 201 for forming a base electrode has been deposited to a thickness of 1.1 μm and properly processed, the SiO$_2$ 200, the n-type GaAs 105 and the n-type AlGaAs 104 are selectively removed by the use of an anisotropic dry etching and a chemical etching. Then, SiN films 203 and 204 each having a thickness of 2000 Å is formed as shown in FIG. 12b by photo chemical vapor deposition at a substrate temperature of 120° C.

Subsequently, with the SiN film 204 on the side walls left, the other SiN films 203 and 204 are removed by an anisotropic dry etching. Then, a base electrode metal 205 is deposited by evaporation, and unnecessary deposited metal is lifted off to form a base electrode as shown in FIG. 12c. In this embodiment, an alloy of Au and Zn is employed as the base electrode metal. The electrode is formed into an ohmic electrode under the alloying conditions that a heat treatment is carried out at a temperature of 450° C. for two minutes.

Since the photo CVD SiN 204 left on the side walls as described above has inferior electrical insulating properties, it may be removed, after the formation of the electrode, by the use of hydrofluoric acid diluted to 1/100 and a new passivation film may be formed by the use of plasma chemical vapor deposition or the like. In the present invention, if the gap between the electrode formed and the semiconductor layer which is electrically isolated from the electrode by the insulator film is entirely filled with the insulator, the parasitic capacitance is increased disadvantageously. Accordingly, if the area between the electrode and the side insulator film is defined by an air gap, it is possible to suppress increase in the parasitic capacitance.

EMBODIMENT 7

Figure 13A:
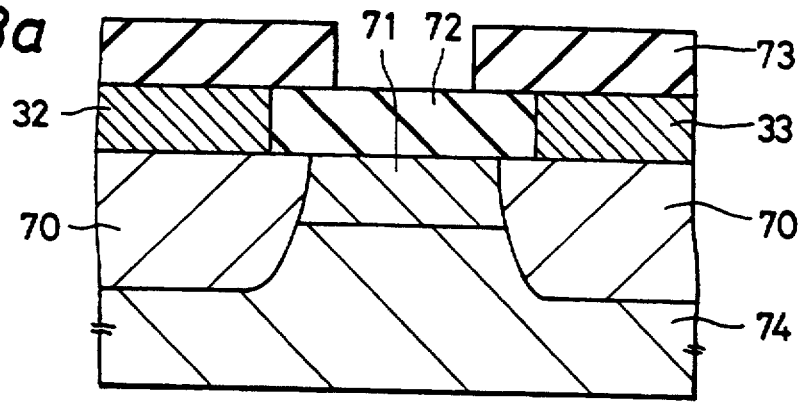
FIGS. 13a to 13c are cross-sectional views of a field effect transistor in accordance with one embodiment of the present invention, which show steps in the process for producing the same.
Figure 13B:
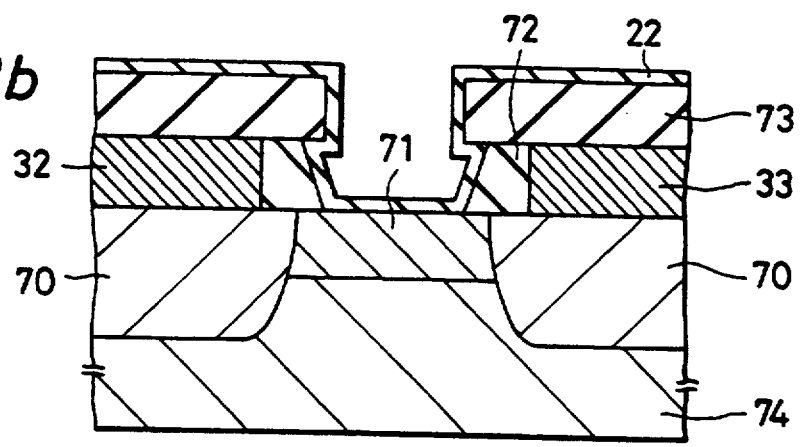
Figure 13C:
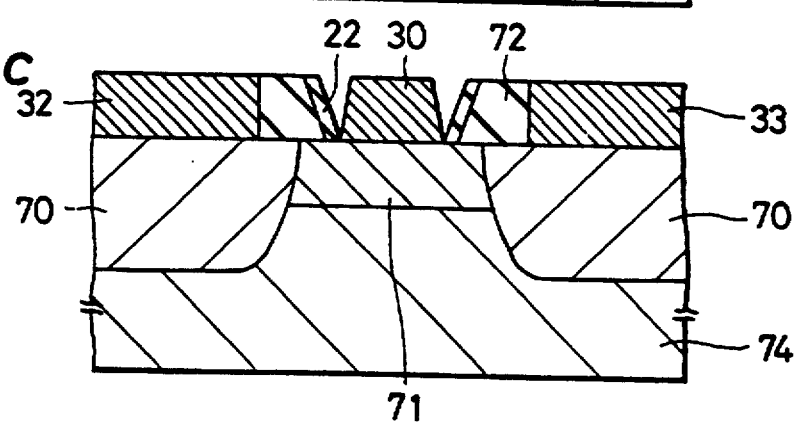

FIGS. 13a to 13c show in combination an embodiment in which the present invention is applied to formation of a GaAs MESFET by ion implantation. An n-type GaAs region 71, n+-type source and drain regions 70, source and drain electrodes 32, 33 and a spacer insulator film 72 are successively formed, and a photoresist 73 for forming a gate is then formed as shown in FIG. 13a. The insulator film 72 is etched to expose the n-type GaAs region 71, and SiN 22 having a thickness of 3000 Å is then deposited by photo chemical vapor deposition at a substrate temperature of 120° C. (see FIG. 13b). The reference numeral 74 denotes a semi-insulating GaAs substrate. The side insulator film 22 is left and other portion of the SiN 22 is etched out using an anisotropic dry etching, and a gate electrode 30 is formed by lift-off. Since the deposition rate of the film 22 formed by photo chemical vapor deposition is relatively low (2 nm/minute to 10 nm/minute), the side insulator film 22 can be controlled with exceedingly excellent controllability.

In this embodiment, the distance or diameter of the opening provided in the gate photoresist shown in FIG. 13a is 0.8 μm, while the film thickness of the SiN formed on the side wall portion by photo chemical vapor deposition is 3000 Å, and the length of the finished gate (see FIG. 13c) is 0.4 μm. Thus, the present invention is a process which is favorably suitable for formation of submicron FETs.

EMBODIMENT 8

FIGS. 14a to 14e show essential steps in the process for producing a 2 DEG-FET employing a GaAs/AlGaAs hetero junction.

Undoped GaAs (generally of the p⁻-type and containing remaining acceptors at a concentration of $10^{14}$ cm$^{-3}$) 317 having a thickness of 1 μm is grown on a semi-insulating GaAs substrate 310 by the use of MBE (Molecular Beam Epitaxy). Then, undoped $Al_xGa_{1-x}As$ 316 having a thickness of 60 Å is formed. Al content x is generally selected to fall within a range from 0.3 to 0.4, and the film thickness is generally selected to be from 0 Å to about 100 Å. Then, $Al_yGa_{1-y}As$ 315 containing Si at a concentration of $1\times10^{19}$ cm$^{-3}$ and having a thickness of 50 Å is formed. Al content x is generally selected to be 0.23 but may be selected to fall within a range from 0.2 to 0.4 according to the purpose of application. The thickness of the film 315 is generally selected to fall within a range from 10 Å to 150 Å. When the film 315 is exceedingly thin, it is common practice to employ Sn (tin) as an n-type dopant in place of Si and select a doping level of $5\times10^{19}$ cm$^{-3}$.

Then, undoped $Al_xGa_{1-x}As$ 314 having a thickness of 150 Å is formed. Al content x is generally selected to fall within a range from 0.3 to 0.4. The thickness of the film 314 generally ranges from 50 Å to 200 Å. Finally, n+-type GaAs 313 having a thickness of 1600 Å is formed for the purpose of lowering the parasitic resistance between the source and the gate. The doping level of Si is selected to be $1\times10^{19}$ cm$^{-3}$. To further lower the parasitic resistance, n+-type Ge or the like may be employed to lower the sheet resistance to several Ω/□ or less. In the case of employing n+-type Ge (the doping level: $10^{20}$ cm$^{-3}$), the film thickness is only required to be on the order of 200 Å to 300 Å (see FIG. 14a).

Figure 14A:
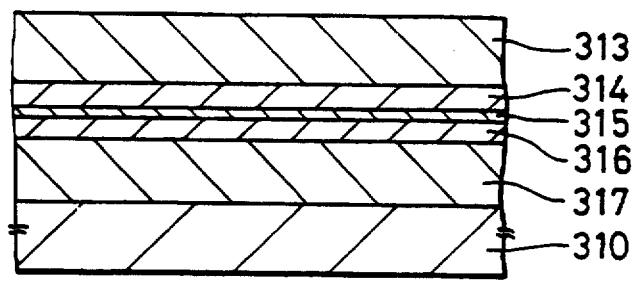
FIGS. 14a to 14e are cross-sectional views of a field effect transistor in accordance with one embodiment of the present invention, which show steps in the process for producing the same.
Figure 14B:
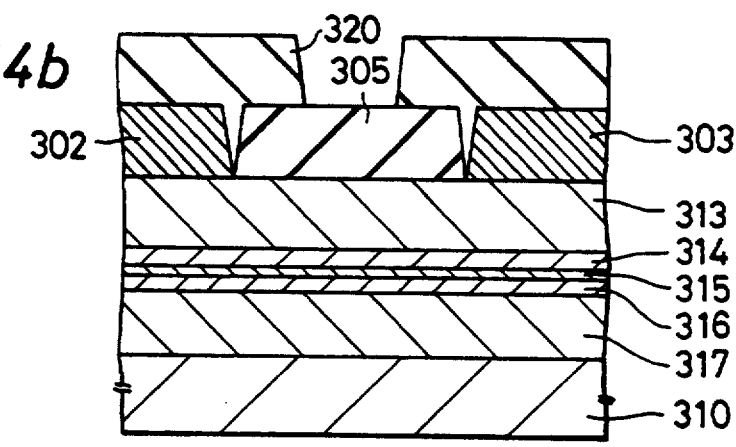
Figure 14C:
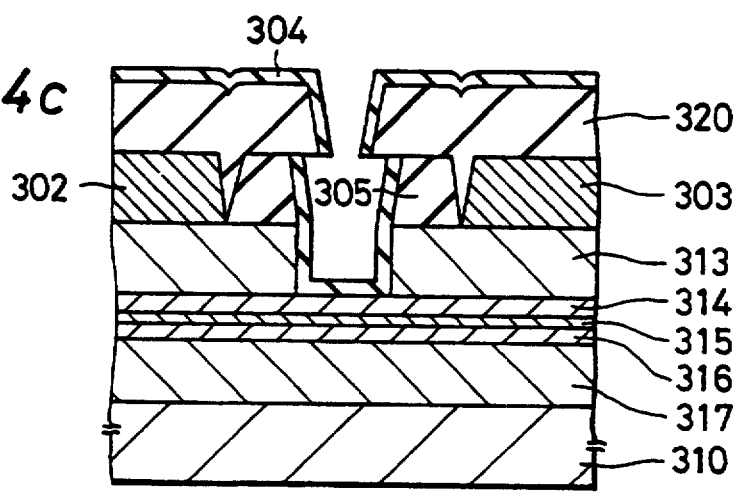
Figure 14D:
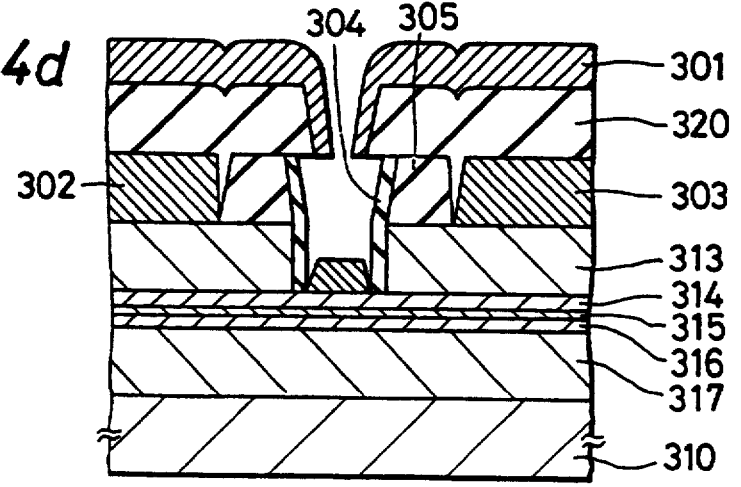

After source and drain electrodes 302 and 303 have been formed using a three-layer structure consisting of AuGe, Ni and Au layers by the lift-off method, an insulator film 305 is formed, and a photoresist 320 for forming a gate is then formed (see FIG. 14b).

After the insulator film (generally CVD SiO$_2$; the thickness: 3500 Å) 305 for passivation has been removed using a dry etching, the n+-type GaAs 313 is selectively removed by a reactive ion etching (RIE) using CCl$_2$F$_2$/He gas (a gas mixture of CCl$_2$F$_2$ and He). After a chemical treatment, Si$_3$N$_4$ 304 having a thickness of 1000 Å is formed by the use of photo chemical vapor deposition. The substrate temperature during the formation of Si$_3$N$_4$ 304 is 130° C., and it has experimentally been confirmed that no unfavorable phenomenon such as thermal deformation of the photoresist occurs at such substrate temperature (see FIG. 14c).

The thickness of the Si$_3$N$_4$ film is generally selected to fall within a range from 100 Å to 1000 Å.

Then, the Si$_3$N$_4$ formed on the bottom of the recessed gate structure and the Si$_3$N$_4$ formed on the photoresist are removed using a conventional dry etching. It is essential that the Si$_3$N$_4$ formed on the side surfaces of the n+-type GaAs is left as it is.

Although in this embodiment Si$_3$N$_4$ is formed by photo chemical vapor deposition, another method may also be employed, such as a method wherein SiO$_2$ is formed by microwave plasma chemical vapor deposition at a low temperature (about 150° C.), or a method wherein an SiO$_2$ target is sputtered by an electron beam to deposit SiO$_2$.

Figure 14E:
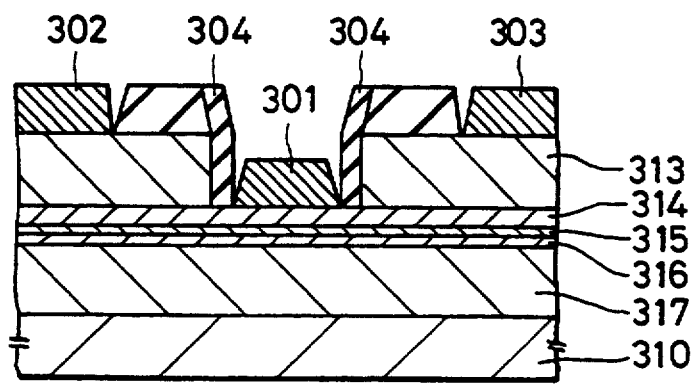

Then, a three-layer film 301 consisting of Ti, Pt and Au layers is deposited by evaporation as a gate metal (see FIG. 14d), and then subjected to lift-off process to obtain an FET having a desired configuration (see FIG. 14e).

As a gate metal, an Al film or a two-layer film consisting of Mo/Au layers may also be employed in addition to the above-described three-layer film 301.

In contrast to the conventional FET shown in FIG. 3, the 2DEG-FET having the above-described structure has its source-gate breakdown voltage improved from 1.5 V to about 10 V. The maximum gate voltage which can be applied to the gate electrode has also been increased from 0.8 V to 2.9 V.

As compared with the gate structure with an overhang shown in FIG. 4, the gate structure in accordance with this embodiment enables improvements in the characteristics of the FET. More specifically, when the gate length $L_g=1$ μm and the gate width=10 μm, the source-gate capacitance can be lowered from 40 fF to 20 fF.

Although in this embodiment the 2DEG-FET employing a GaAs/AlGaAs hetero junction is exemplarily shown, the present invention is also effective in the case of employing other hetero junctions, e.g., InP/InGaAs, GaAs/Ge, AlGaAs/InGaAs, etc.

In addition, the present invention is also effective in the case of employing a two-dimensional hole gas and in the case where an n-type impurity employed in the present invention is replaced by a p-type impurity such as Be or Mg.

EMBODIMENT 9

Figure 15:
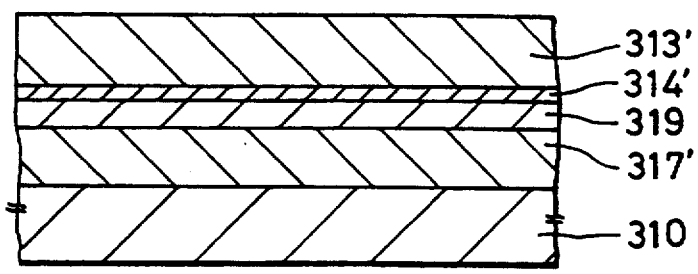
FIG. 15 is a cross-sectional view of a field effect transistor in accordance with one embodiment of the present invention, which shows one step in the process for producing the same.

FIG. 15 shows an embodiment in which the present invention is applied to a GaAs MESFET.

Undoped GaAs or undoped $Al_yGa_{1-y}As$ (y: about 0.5) 317′ having a thickness of 1 μm is formed on a semi-insulating GaAs substrate 310, and GaAs 319 containing Si at a concentration of $5\times10^{17}$ cm$^{-3}$ and having a thickness of 500 Å is then formed thereon. Further, undoped $Al_yGa_{1-y}As$ 314' having a thickness of 50 Å is formed, and n+-type Ge (the doping level: $10^{20}$ cm$^{-3}$) 313' having a thickness of 500 Å is formed thereon.

The process for producing the FET is almost the same as that in the case of the embodiment 8. This embodiment mainly differs from the embodiment 8 in that, since n+-type Ge is employed to form source and drain regions, Al is employed as an ohmic metal, and the n+-type Ge 313'0 and the AlGaAs 314' are formed by a dry etching using $CF_4$.

As has been described above, in the semiconductor device according to the present invention, the electrode formed within the recess is isolated from a high impurity concentration semiconductor layer and/or another electrode metal layer through a side insulator film. Accordingly, it is possible to reduce the distance between the electrode within the recess and the high impurity concentration semiconductor layer and/or the second electrode metal layer to 0.15 μm or less and to control the distance with considerably excellent controllability. Since the second electrode metal is provided on the high impurity concentration barrier semiconductor layer, the contact resistance $\gamma_c$ of the second electrode metal can be lowered to 0.02 Ωmm or less. Thus, since the present invention enables minimization of the resistance between the source and gate of an FET, it is possible to realize great improvements in the transistor characteristics. In addition, formation of side walls of a recess gate by the use of a low-temperature process such as photo chemical vapor deposition which is carried out at a temperature within a range from room temperature to 100° C. can be completed by only one photoresist step, and there is no problem in regard to the fringing capacitance which would otherwise be caused by the overhang of the gate.

In a practical example of the recessed gate structure according to the present invention, a side insulator film was formed between an n+-type cap layer and a gate metal in such a manner that the insulator film was disposed only on the inner side of the gate recess, and the gate metal was formed only inside the gate recess. With this arrangement: (1) it was possible to make the source-gate breakdown voltage one digit higher than that in the case of the conventional recessed gate structure; and (2) it was possible to halve the source-gate capacitance.

It should be noted that, throughout the drawings in this application, the same reference numerals denote the same portions.

What is claimed is:

1. A semiconductor device having a plurality of layers comprising a metal electrode directly connected to one active layer of said semiconductor device and which is isolated from another layer provided on said one active layer through an air gap, said metal electrode being formed inside a cut portion in said another layer, and said air gap having a width, corresponding to a spacing distance between said metal electrode and said another layer, of less than 1000 Å but greater than or equal to 100 Å.

2. A semiconductor device according to claim 1, wherein said another layer is comprised of a low-resistivity semiconductor layer.

3. A semiconductor device comprising:
   a plurality of vertically stacked semiconductor layers, wherein one of which includes a channel region;
   a pair of electrodes electrically connected to said channel region; and
   gate means for controlling current flowing in said channel region,
   wherein another one of said semiconductor layers includes a pair of low-resistivity semiconductor cap regions which form a heterojunction with a different compound type semiconductor region corresponding to a still further one of said semiconductor layers, the cap regions are interposed between said channel region and the electrodes, respectively, and have formed therethrough said gate means which is comprised of a recessed gate structure so as to lower parasitic resistance between said gate means and the electrodes and which is dimensioned not to have a portion extending directly above said cap regions, and wherein said cap regions are respectively isolated from said gate means through an inorganic side wall insulator film disposed on side walls inside the recess, said inorganic side wall insulator film having a width less than 3000 Å but greater than or equal to 100 Å.

4. A semiconductor device according to claim 3, wherein said cap regions have a high dopant impurity concentration.

5. A semiconductor device according to claim 4, wherein each of said cap regions is of a thickness of about 1600 Å or more.

* * * * *